United States Patent
Xue et al.

(10) Patent No.: US 7,259,699 B1
(45) Date of Patent: Aug. 21, 2007

(54) CIRCUITRY FOR PROVIDING CONFIGURABLE RUNNING DISPARITY ENFORCEMENT IN 8B/10B ENCODING AND ERROR DETECTION

(75) Inventors: Ning Xue, Fremont, CA (US); Chong H Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/285,944

(22) Filed: Nov. 23, 2005

(51) Int. Cl.
*H03M 7/00* (2006.01)
(52) U.S. Cl. .......................................... 341/59; 341/50
(58) Field of Classification Search ............. 341/50–90
See application file for complete search history.

(56) References Cited

U.S. PATENT DOCUMENTS

| | | | |
|---|---|---|---|
| 4,486,739 A | 12/1984 | Franaszek et al. | |
| 5,907,566 A * | 5/1999 | Benson et al. | 714/798 |
| 6,624,763 B2 * | 9/2003 | Kuo et al. | 341/58 |
| 6,650,140 B2 | 11/2003 | Lee et al. | |
| 6,724,328 B1 | 4/2004 | Lui et al. | |
| 6,750,675 B2 | 6/2004 | Venkata et al. | |
| 6,854,044 B1 | 2/2005 | Venkata et al. | |
| 6,989,715 B2 * | 1/2006 | Yin | 330/253 |
| 7,061,407 B1 * | 6/2006 | Lee | 341/50 |

* cited by examiner

*Primary Examiner*—Lam T. Mai
(74) *Attorney, Agent, or Firm*—Fish & Neave IP Group of Ropes & Gray LLP; Robert R. Jackson

(57) ABSTRACT

An integrated circuit like a programmable logic device ("PLD") includes a communication channel employing 8B/10B coding. Disparity information determined by 8B/10B decoder circuitry in the communication channel is supplied to other circuitry of the PLD so that any requirement for disparity to have a particular value in conjunction with certain received codes can be checked. On the transmitter side, circuitry is provided for selectively forcing the 8B/10B encoder to use a commanded disparity (which can be either positive or negative) under particular circumstances.

16 Claims, 3 Drawing Sheets

CIRCUITRY FOR PROVIDING CONFIGURABLE RUNNING DISPARITY ENFORCEMENT IN 8B/10B ENCODING AND ERROR DETECTION

BACKGROUND OF THE INVENTION

This invention relates to integrated circuits such as programmable logic devices ("PLDs"), and more particularly to serial data signal interface or transceiver circuitry for use on PLDs or similar circuitry.

There is increasing interest in using high-speed serial data signals for communication between various devices in systems. For example, the devices in a system may be various integrated circuits that are mounted on a printed circuit board ("PCB"). The high-speed serial communication between the devices in such a system may take place via circuit traces on the PCB. One or more of the devices may be a PLD or that general type of relatively general-purpose, programmable or configurable device. All such devices to which the invention can be applied may sometimes be referred to generically as PLDs. This terminology is employed solely for convenience and is not intended to limit the invention to any particular narrow class of devices.

There are many communication protocols that are known for use in high-speed serial data communication. It is desirable for a PLD (which is intended to be a relatively general-purpose device) to be useful in a number of different possible applications. Indeed, as a general matter, the more possible uses a PLD can satisfy, the better (e.g., because it increases the market for that PLD product). For example, it may be desirable to provide a PLD that can support many different high-speed serial data communication protocols. Those protocols may include industry-standard protocols and protocols that a user may design on a customized basis.

High-speed serial data communication may be supported on a PLD by including on the PLD some circuitry that is dedicated to performing certain tasks associated with such communication. Such dedicated circuitry may be referred to as "hard IP" (IP being an acronym for intellectual property). The hard IP circuitry may be controllable, programmable, or configurable in some respects to adapt or customize it to particular communication protocols. Hard IP (rather than the general-purpose logic of the PLD) may be used for some aspects of high-speed serial communication for any of several reasons. These may include the need to provide higher-speed circuitry to keep up with the extremely fast bit rates of the serial communication, the large number of general-purpose logic elements that would be required to perform some of the complex encoding/decoding tasks required for some high-speed serial communication protocols, etc. Other parts of the communication task can be performed by other parts of the PLD circuitry (e.g., the so-called media access control ("MAC") layer of the PLD and/or the general-purpose programmable logic of the PLD).

Many high-speed serial communication protocols use a coding scheme known as 8-bit/10-bit or 8B/10B coding. See Franaszek et al. U.S. Pat. No. 4,486,739, which is hereby incorporated by reference herein in its entirety. Although there is a basic 8B/10B scheme, different communication protocols may use that scheme in somewhat different ways. It is desirable for a PLD to include circuitry that supports these different versions of use of 8B/10B coding so that the PLD can be used to support a wide range of communication protocols employing such coding.

SUMMARY OF THE INVENTION

In accordance with the invention, an integrated circuit such as a PLD includes a data communication channel employing 8B/10B coding. On the receiver side, the 8B/10B decoder circuitry passes on, to other circuitry of the PLD, its disparity determination associated with each byte, along with the decoded byte. This allows the other circuitry of the PLD to perform any disparity checking that is required for any byte by the communication protocol being implemented.

On the transmitter side circuitry is provided for allowing the PLD to force the 8B/10B encoder circuitry to use a particular disparity (which can be either positive or negative) in connection with encoding a byte, as may be required by the communication protocol being implemented.

Further features of the invention, its nature and various advantages, will be more apparent from the accompanying drawings and the following detailed description.

DETAILED DESCRIPTION

Figure 1:
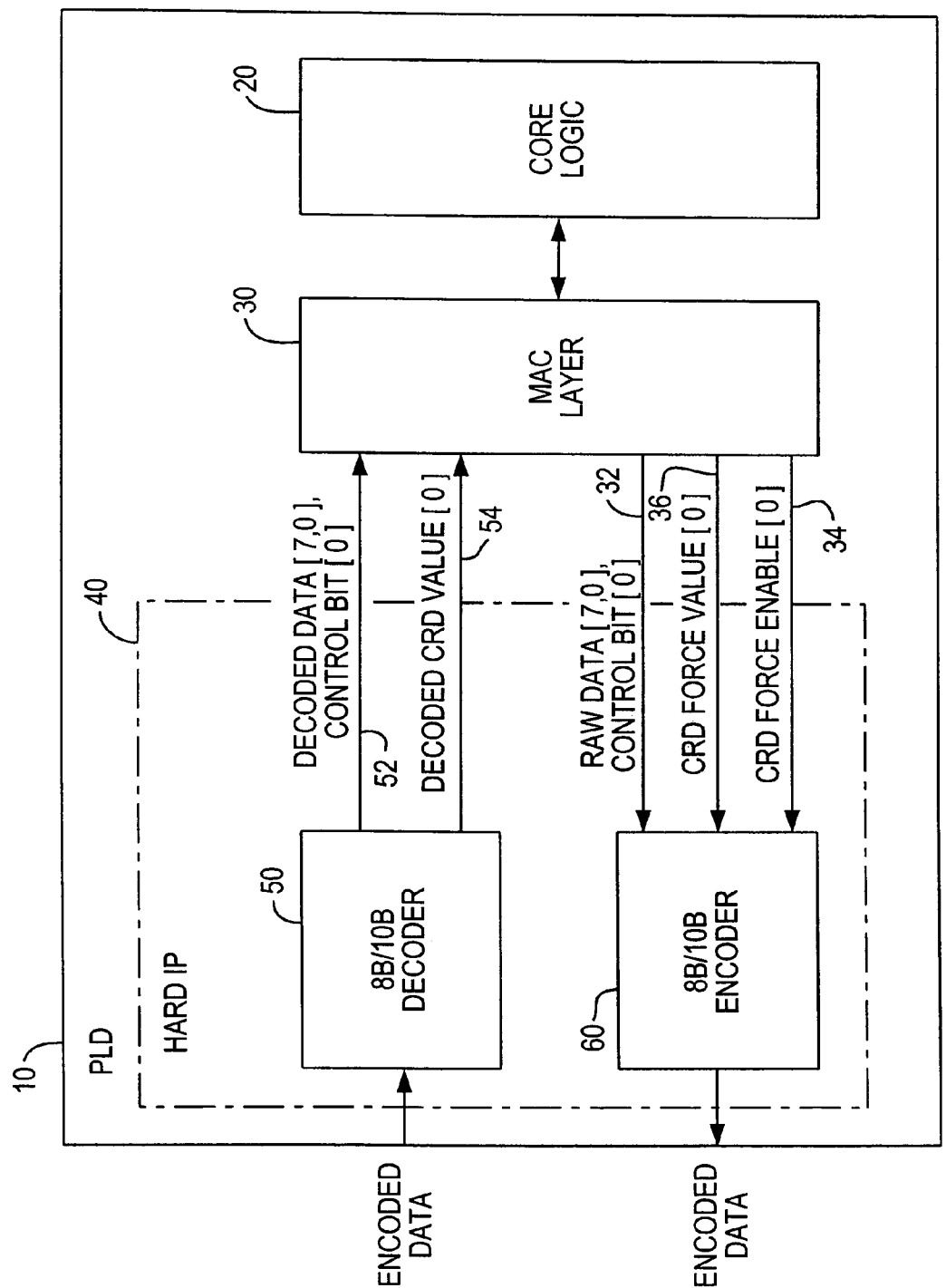
FIG. 1 is a simplified block diagram of an illustrative embodiment of circuitry in accordance with the invention.

As shown in FIG. 1, PLD 10 includes core logic portion 20, media access control ("MAC") layer portion 30, and hard IP (intellectual property) portion 40. Core logic 20 is the traditional major portion of a PLD. It generally includes such things as programmable logic, blocks of random access memory, etc., and it is programmable or configurable to perform any of many different logic or similar tasks. MAC layer 30 is circuitry on the PLD that is adapted for controlling connections to other circuitry that is external to the PLD. Hard IP 40 is circuitry on the PLD that is at least partly hard-wired to perform particular, relatively high-level and/ or complex tasks.

In this case the portion of hard IP 40 that is shown is (1) circuitry 50 for converting successive bytes of ten bits of information to corresponding successive bytes of eight bits of information, and (2) circuitry 60 for converting successive bytes of eight bits of information to corresponding successive bytes of ten bits of information. These conversions 50 and 60 are performed in accordance with the principles shown in the above-mentioned Franaszek et al. patent. Among the purposes of these conversions is to produce ten-bit bytes that can be transmitted with little or no accumulation of a net excess of binary ones or binary zeros. Such a net accumulation is referred to as disparity, running disparity, or current running disparity ("CRD"). If the net accumulation is of ones, it is called positive disparity. If the net accumulation is of zeros, it is called negative disparity. (Disparity is defined even in situations in which the number of ones and zeros is equal, based on whether the last bit transmitted or to be transmitted is a one (positive disparity) or a zero (negative disparity).) As in the Franaszek et al. patent, each of circuitries 50 and 60 can determine the disparity of each ten-bit byte that it handles, and it can also keep track of the running disparity (CRD) of a succession of ten-bit bytes that it is handling.

FIG. 1 omits other elements that may be included in hard IP 40. For example, on the receiver (decoder 50) side hard IP 40 may also include serial data receiver buffer circuitry, CDR (clock and data recovery) circuitry, deserializer circuitry, and byte alignment circuitry upstream from decoder 50, and it may also include phase compensation FIFO circuitry downstream from decoder 50. Thus decoder 50 may be part of high-speed serial interface ("HSSI") circuitry in hard IP 40. For more information about such HSSI circuitry see, for example, Aung et al. U.S. patent application Ser. No. 09/805,843, filed Mar. 13, 2001, Lee et al. U.S. Pat. No. 6,650,140, Venkata et al. U.S. Pat. No. 6,750,675, Venkata et al. U.S. Pat. No. 6,854,044, Lui et al. U.S. Pat. No. 6,724,328, Venkata et al. U.S. patent application Ser. No. 10/317,264, filed Dec. 10, 2002, Venkata et al. U.S. patent application Ser. No. 10/637,982, filed Aug. 8, 2003, Lam et al. U.S. patent application Ser. No. 10/621,074, filed Jul. 15, 2003, Venkata et al. U.S. patent application Ser. No. 10/670,813, filed Sep. 24, 2003, Shumarayev U.S. patent application Ser. No. 11/211,989, filed Aug. 24, 2005, and Shumarayev et al. U.S. patent application Ser. No. 11/230,002, filed Sep. 19, 2005. On the transmitter (encoder 60) side, FIG. 1 omits such other possible elements as phase compensation FIFO circuitry upstream from encoder 60 and deserializer and transmitter driver circuitry downstream from encoder 60. See again the references mentioned earlier in this paragraph. By including both HSSI receiver and transmitter circuitry, hard IP 40 can constitute what may be called HSSI transceiver circuitry.

In 8B/10B coding certain eight-bit bytes have two ten-bit equivalents. One of these equivalents has positive disparity and the other equivalent has negative disparity. In general, either equivalent can be used, and the choice of which equivalent to use in any particular instance is generally based on selecting the alternative that will reduce or reverse the CRD. For example, if the CRD is +1 and the next eight-bit byte can be encoded using a ten-bit code having +2 disparity or a ten-bit code having −2 disparity, the latter choice will generally be made so that after encoding that next eight-bit byte, the CRD of the ten-bit-byte data stream is −1.

Some data communication protocols require some ten-bit bytes to have a particular disparity, regardless of the CRD. Moreover, that required disparity may be either positive or negative. As just one example of this, the data communication protocol known as Fibre Channel requests that end of packet bytes be encoded with negative disparity. Receiver circuitry must know whether the disparity of a received end of packet byte is positive or negative in order to determine whether or not the end of packet byte is correct.

Looking again at FIG. 1, for each ten-bit byte that decoder 50 receives, the decoder sends eight bits of decoded data, one control bit, and one bit indicating whether the CRD value is positive or negative. For example, the CRD value bit 54 can be 1 if CRD is positive, and the CRD value bit can be 0 if CRD is negative. The control bit referred to earlier in this paragraph is similar to what is described in the above-mentioned Franaszek et al. patent and can be used, for example, to indicate whether the associated eight-bit byte is data or a "special character." Information applied to MAC layer 30 is typically passed on to the core logic circuitry 20 of PLD 10. Accordingly, because the decoded CRD value 54 is now available with each decoded data and control value 52, PLD core 20 can be programmed to perform any desired check on whether or not this information 52 and 54 is correctly consistent. For example, if PLD 10 is implementing Fibre Channel communication, CRD should be negative when an end of packet byte is received. This is so because CRD should be correct at the start of a packet, and if the packet size is correct, CRD will be negative when the end of packet byte arrives. Accordingly, the ability of PLD core 20 to check CRD value 54 in conjunction with receipt of an end of packet byte is an important check on the correctness of Fibre Channel communication. PLD core 20 can be programmed to perform this type of check (or any other type of check based on CRD value 54 that it may be appropriate to perform, given the communication protocol that PLD 10 is implementing).

On the transmitter (encoder 60) side, the circuitry gives the ability to control CRD from core logic 20, as may be required, for example, for encoding certain bytes in certain data communication protocols. Each successive eight-bit byte and a control bit are applied to encoder 60 via leads 32. Another signal applied to encoder 60 is a CRD force enable signal on lead 34. Still another signal applied to encoder 60 is a CRD force value signal on lead 36. The source of the signals on leads 32, 34, and 36 is core logic 20, although these signals may be conveyed to decoder 60 via MAC layer 30 as shown in FIG. 1. The control bit on one of leads 32 is similar to the above-described control bit on one of leads 52. The CRD force enable signal on lead 34 enables encoder 60 to ignore its own internally determined CRD value, which would normally be used by the encoder to select which of two alternative ten-bit codes to use for the next byte based on the usual objective of reducing or reversing CRD for the output encoded data. Instead, when CRD force enable signal 34 is asserted, encoder 60 chooses for the next ten-bit code the alternative having the disparity appropriate for the value of the CRD force value signal on lead 36.

To give a concrete example of the foregoing, assume that the CRD force enable signal on lead 34 is asserted (logic 1). Also assume that a CRD force value signal 36 of 0 is a request for negative disparity, and that a CRD force value signal 36 of 1 is a request for positive disparity. Assume further that the circuitry is implementing a communication protocol (e.g., Fibre Channel) in which communication should begin with a particular CRD value. After PLD power-up, PLD core 20 does not know what CRD value is in an encoder 60. The circuitry of this invention allows PLD core 20 to force the first CRD value via lead 36 to a particular value (with lead 34 enabling that forcing). In this way the CRD of the communication channel is realigned by PLD core 20. After that realignment has taken place, core logic 20 can deassert CRD force enable signal 34, and encoder 60 can take over responsibility for maintaining CRD.

Figure 2:
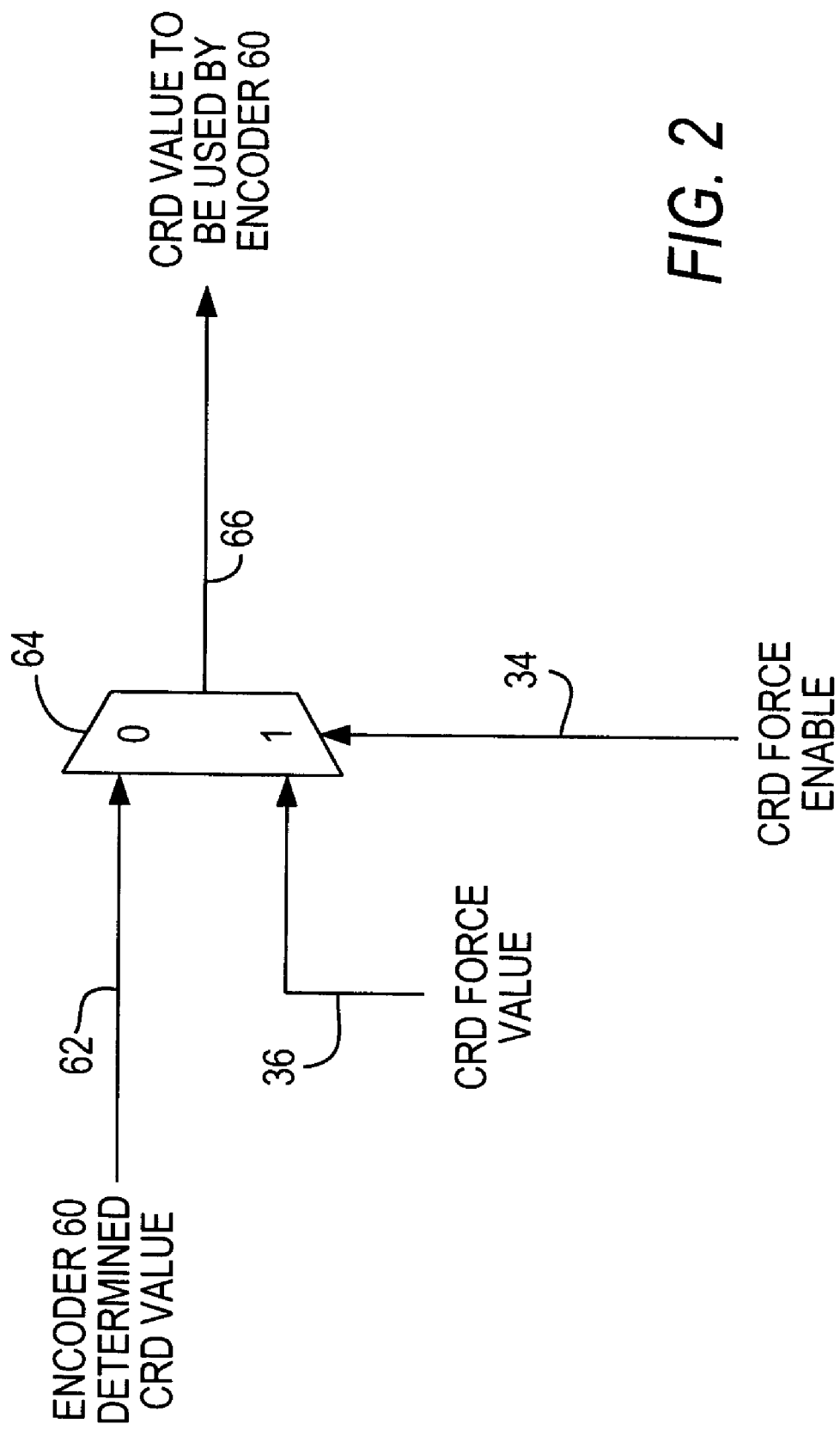
FIG. 2 is a simplified schematic block diagram of an illustrative embodiment of a portion of circuitry of the type shown in FIG. 1 in accordance with the invention.

FIG. 2 shows an illustrative embodiment of circuitry that can be included in hard IP 40 to make use of CRD force enable signal 34 and CRD force value signal 36. As shown in FIG. 2, CRD force enable signal 34 is applied to the selection control input terminal of multiplexer ("mux") circuitry 64. The CRD value 62 determined by encoder 60 is applied to one of the selectable inputs of mux 64. CRD force value signal 36 is applied to the other selectable input of mux 64. Accordingly, the state of CRD force enable signal 34 determines whether encoder 60 uses (lead 66) the CRD value 62 the encoder has determined from the data it is processing or CRD force value 36. In other words, the circuitry shown in FIG. 2 allows CRD force value 36 to selectively over-ride encoder-determined CRD value 62, depending on the state of CRD force enable signal 34.

From the foregoing it will be seen that the circuitry of the invention can be used to satisfy any possible running disparity setting and/or error detection requirement of an 8B/10B communication protocol.

Although only one data sample (byte) is shown being handled at any one time in each direction in FIG. 1, it will be understood that hard IP circuitry 40 may handle several bytes in parallel adjacent the interface between circuitry 40 and the other circuitry such as MAC layer circuitry 30. For example, hard IP 40 may accumulate four successive bytes and associated decoded CRD values 54 before passing all of that information on to circuitry 30/20 in parallel. Thus in that example, at the interface between circuitry 40 and circuitries 30/20 there will be 36 connections for information like 52 in FIG. 1 and four connections for decoded CRD values 54. Similarly, on the transmitter side in such an example, there will be 36 connections at the circuitry 40-30/20 interface for information like 32 in FIG. 1, four connections for CRD force enable signals 34 (one for each byte to be encoded), and four connections for CRD force value signals 36 (again, one for each byte to be encoded).

Figure 3:
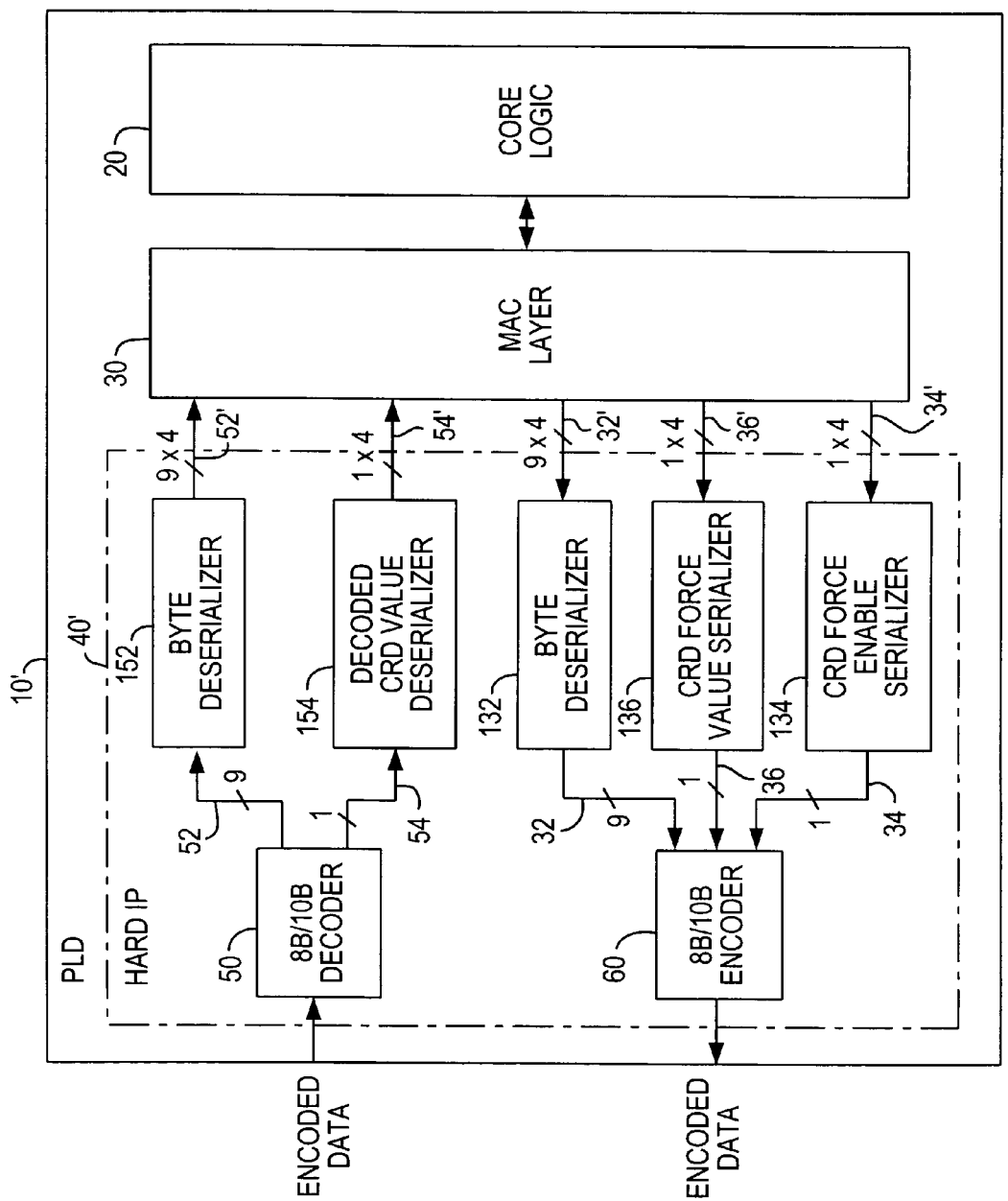
FIG. 3 is a simplified block diagram of another illustrative embodiment of circuitry in accordance with the invention.

FIG. 3 shows an alternative embodiment (described in general terms in the preceding paragraph) in which hard IP circuitry 40' is modified to include the additional elements detailed below. Byte desterilizer circuitry 152 accumulates the information 52 for four successive bytes output by decoder 50. Circuitry 152 outputs the information for each group of four bytes in parallel to circuitry 30/20 via leads 52'. Decoded CRD value deserializer 154 operates in parallel with circuitry 152 to accumulate the information 54 output by decoder 50 for each of the four bytes simultaneously being accumulated by circuitry 152. Circuitry 154 outputs the information it has accumulated in parallel to circuitry 30/20 via leads 54'. Byte serializer circuitry 132 receives information for four bytes in parallel via leads 32' and outputs that information one byte at a time via leads 32. CRD force enable serializer circuitry 134 receives force enable signals for four bytes in parallel via leads 34' and outputs that information for one byte at a time via lead 34. CRD force value serializer circuitry 136 operates similarly with respect to force value signals for four bytes.

Inclusion of serializer/deserializer circuitry 152, 154, 132, 134, and 136 in hard IP 40' allows encoded data to be received and/or transmitted at higher bit rates without having to excessively increase the byte rate at which circuitry 20 and 30 must operate. Although the serializer/deserializer circuitry shown in FIG. 3 has a capacity of four bytes, it will be understood that this is only an example, and a different byte capacity (e.g., two bytes or eight bytes) can be employed instead if desired.

Again it is noted that FIGS. 1 and 3 have been simplified by the omission of such other possible circuit components as phase compensation FIFOs. It will be appreciated, however, that such other components preserve data and control bits and therefore do not materially affect the invention as shown and described herein.

It will be understood that the foregoing is only illustrative of the principles of the invention, and that various modifications can be made by those skilled in the art without departing from the scope and spirit of the invention. For example, the transceiver channel shown in FIG. 1 or FIG. 3 can be just one of several similar transceiver channels included on a PLD like the one shown in FIG. 1 or FIG. 3.

The invention claimed is:

1. An integrated circuit comprising:
   logic circuitry;
   data communication circuitry including 8B/10B encoding circuitry for converting successive eight-bit bytes to corresponding ten-bit bytes; and
   circuitry for allowing the logic circuitry to force the 8B/10B encoding circuitry to a particular disparity, which can be either positive or negative, regardless of the current running disparity (CRD).

2. The integrated circuit defined in claim 1 wherein the data communication circuitry further includes 8B/10B decoding circuitry for converting successive ten-bit bytes to corresponding eight-bit bytes.

3. The integrated circuit defined in claim 2 further comprising:
   circuitry for applying disparity information determined by the 8B/10B decoding circuitry in association with each ten-bit byte to the logic circuitry.

4. The integrated circuit defined in claim 3 wherein the logic circuitry is configurable to detect whether the disparity information for particular bytes is correct for information of a type represented by those bytes.

5. The integrated circuit defined in claim 1 wherein the circuitry for allowing comprises:
   a first connection for indicating that the 8B/10B encoding circuitry is to be forced; and
   a second connection for indicating whether the 8B/10B encoding circuitry is to be forced to positive or negative disparity.

6. The integrated circuit defined in claim 1 wherein the integrated circuit comprises a programmable logic device in which the logic circuitry is programmable.

7. An integrated circuit comprising:
   logic circuitry;
   data communication circuitry including 8B/10B decoding circuitry for converting successive ten-bit bytes to corresponding eight-bit bytes; and
   circuitry for applying disparity information determined by the 8B/10B decoding circuitry in association with each ten-bit byte to the logic circuitry.

8. The integrated circuit defined in claim 7 wherein the logic circuitry is configurable to detect whether the disparity information for particular bytes is correct for information of a type represented by those bytes.

9. The integrated circuit defined in claim 7 wherein the integrated circuit comprises a programmable logic device in which the logic circuitry in programmable.

10. A programmable logic device comprising:
    programmable logic circuitry;
    at least partly hard-wired data communication circuitry including 8B/10B encoding circuitry and 8B/10B decoding circuitry;
    circuitry for applying to the logic circuitry disparity information determined by the 8B/10B decoding circuitry in association with each ten-bit byte; and
    circuitry for allowing the logic circuitry to force the 8B/10B encoding circuitry to a particular disparity, which can be either positive or negative, regardless of the current running disparity (CRD).

11. The programmable logic device defined in claim 10 wherein the logic circuitry is programmed to detect whether the disparity information for particular bytes is correct for information of a type represented by those bytes.

12. The programmable logic device defined in claim 10 wherein the circuitry for allowing comprises:
    a first connection for a signal indicating that the 8B/10B encoding circuitry is to be forced to employ a particular disparity.

13. The programmable logic device defined in claim 12 wherein the circuitry for allowing further comprises:
    a second connection for a signal indicating whether the particular disparity is to be positive or negative.

14. The programmable logic device defined in claim 10 wherein the at least partly hard-wired data communication circuitry further includes:

byte deserializer circuitry for accumulating a plurality of successive bytes output by the 8B/10B decoding circuitry and periodically outputting the accumulated plurality of bytes to the logic circuitry in parallel; and byte serialization circuitry for receiving a plurality of bytes in parallel from the logic circuitry and outputting those bytes one after another to the 8B/10B encoding circuitry.

15. The programmable logic device defined in claim 14 wherein the circuitry for applying accumulates the disparity information for each of the plurality of bytes accumulated by the byte deserializer circuitry and outputs the accumulated disparity information in parallel with the outputting of the accumulated plurality of bytes.

16. The programmable logic device defined in claim 14 wherein the circuitry for allowing receives disparity-forcing information in parallel for each of the plurality of bytes received in parallel by the byte serialization circuitry and outputs the disparity-forcing information for each of those bytes in parallel with the outputting of each byte by the byte serialization circuitry.

* * * * *